(12) United States Patent
Chou et al.

(10) Patent No.: US 9,966,139 B2
(45) Date of Patent: May 8, 2018

(54) RESISTIVE RANDOM ACCESS MEMORY DEVICE

(71) Applicant: Taiwan Semiconductor Manufacturing Co., Ltd., Hsin-Chu (TW)

(72) Inventors: Chung-Cheng Chou, Hsin-Chu (TW); Yu-Der Chih, Hsin-Chu (TW); Wen-Ting Chu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/730,398

(22) Filed: Oct. 11, 2017

(65) Prior Publication Data

US 2018/0033484 A1     Feb. 1, 2018

Related U.S. Application Data

(63) Continuation of application No. 15/216,520, filed on Jul. 21, 2016, now Pat. No. 9,792,987.

(51) Int. Cl.
*G11C 13/00* (2006.01)
*H01L 27/24* (2006.01)
*H01L 23/522* (2006.01)
*H01L 45/00* (2006.01)

(52) U.S. Cl.
CPC ...... *G11C 13/0069* (2013.01); *G11C 13/0007* (2013.01); *G11C 13/0097* (2013.01); *H01L 23/522* (2013.01); *H01L 27/2436* (2013.01); *H01L 27/2463* (2013.01); *H01L 45/1233* (2013.01); *H01L 45/1273* (2013.01); *H01L 45/146* (2013.01); *H01L 45/1616* (2013.01)

(58) Field of Classification Search
CPC ............ G11C 13/0069; G11C 13/0007; G11C 13/0097; H01L 23/522; H01L 27/2436; H01L 27/2463
See application file for complete search history.

(56) References Cited

U.S. PATENT DOCUMENTS

| 8,593,854 | B1 | 11/2013 | Chih et al. |
| 8,869,436 | B2 | 10/2014 | Tsai et al. |
| 9,019,743 | B2 | 4/2015 | Tsai et al. |
| 9,023,699 | B2 | 5/2015 | Chang et al. |

(Continued)

*Primary Examiner* — Tri Hoang
(74) *Attorney, Agent, or Firm* — Duane Morris LLP

(57) ABSTRACT

A memory architecture includes: a first memory macro comprising a first plurality of memory cells that each comprises a first variable resistance dielectric layer with a first geometry parameter; and a second memory macro comprising a second plurality of memory cells that each comprises a second variable resistance dielectric layer with a second geometry parameter, wherein the first geometry parameter is different from the second geometry parameter thereby causing the first and second memory macros to have first and second endurances. The first and second variable resistance dielectric layers are formed using a single process recipe. The first endurance comprises a maximum number of cycles for which the first plurality of memory cells can transition between first and second logical states, and the second endurance comprises a maximum number of cycles for which the second plurality of memory cells can transition between the first and second logical states.

20 Claims, 13 Drawing Sheets

(56) References Cited

U.S. PATENT DOCUMENTS

| | | | |
|---|---|---|---|
| 9,053,781 B2 | 6/2015 | Tsai et al. | |
| 9,076,522 B2 | 7/2015 | You et al. | |
| 9,153,343 B2 | 10/2015 | Chu et al. | |
| 9,196,360 B2 | 11/2015 | Chou et al. | |
| 9,224,470 B1 | 12/2015 | Chiu et al. | |
| 2010/0054017 A1* | 3/2010 | Maejima | G11C 13/0011 365/148 |
| 2013/0135919 A1* | 5/2013 | Hamada | G11C 7/14 365/148 |
| 2013/0234094 A1 | 9/2013 | Chang et al. | |
| 2013/0329484 A1* | 12/2013 | Tamai | G11C 13/0069 365/148 |
| 2014/0166961 A1 | 6/2014 | Liao et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2015/0048297 A1 | 2/2015 | Hsieh et al. | |
| 2015/0085558 A1 | 3/2015 | Chang et al. | |
| 2015/0109849 A1 | 4/2015 | Tsai et al. | |
| 2015/0109850 A1 | 4/2015 | Chang et al. | |
| 2015/0170741 A1 | 6/2015 | Chih et al. | |
| 2015/0269997 A1 | 9/2015 | Lin et al. | |
| 2015/0380063 A1 | 12/2015 | Chang et al. | |

* cited by examiner

RESISTIVE RANDOM ACCESS MEMORY DEVICE

CROSS REFERENCE TO RELATED APPLICATIONS

This application is a continuation of U.S. patent application Ser. No. 15/216,520, filed Jul. 21, 2016, now U.S. Pat. No. 9,792,987, which is incorporated by reference herein in its entirety.

BACKGROUND

Integrated circuits that serve as memory devices or include memory portions are very popular and serve a variety of functions in the electronics world. Resistive random-access memory (RRAM) devices are non-volatile memory type devices formed using semiconductor manufacturing methods. The RRAM device bears some similarities to conductive-bridging RAM (CBRAM) and phase change memory devices.

Generally, RRAM devices operate under the principle that a dielectric, which is normally insulating, can be made to conduct through a filament or conduction path formed after the application of a sufficiently high voltage. The conduction path formation can arise from different mechanisms, including but not limited to defect, metal migration, oxygen vacancy, etc. Various different dielectric materials may be used in RRAM devices. Once the filament or conduction path is formed, it may be reset, i.e. broken, resulting in a high resistance state (HRS) or set, i.e. re-formed, resulting in a lower resistance (LRS), by an appropriately applied voltage, respectively.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
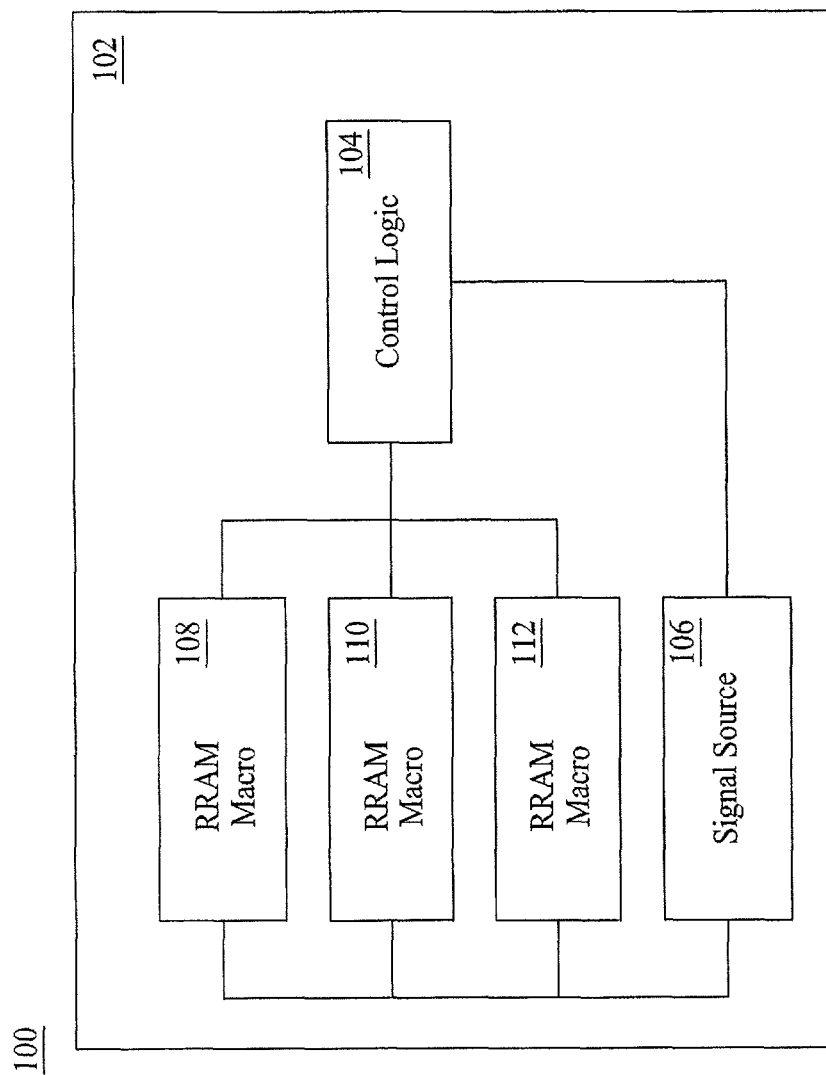
FIG. 1 illustrates an exemplary block diagram of a resistive random access memory (RRAM) architecture in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Additionally, it will be understood that when an element is referred to as being "connected to" or "coupled to" another element, it may be directly connected to or coupled to the other element, or one or more intervening elements may be present.

In recent years, unconventional nonvolatile memory (NVM) devices, such as ferroelectric random access memory (FRAM) devices, magnetic random access memory (MRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

In general, an RRAM device, or more particularly an RRAM cell, includes an upper (anode) electrode and a lower (cathode) electrode with a variable resistance dielectric layer interposed between the upper and lower electrodes. In some examples, an RRAM cell may further include a capping layer interposed between the upper electrode and the variable resistance dielectric layer thereby causing the RRAM cell to have a bipolar switching behavior. The term "bipolar" as used herein refers to the two voltage polarities of an RRAM cell that exhibits a first conductive behavior with a first polarity of voltage applied across the upper and lower electrodes, and a second conductive behavior with a second polarity (a polarity opposite to the first polarity) of voltage applied across the upper and lower electrodes. As described above, during a write operation to the RRAM cell, a 'set' voltage is applied across the upper and lower electrodes to change the variable resistance dielectric layer from a first resistivity (e.g., a high resistance state (HRS)) to a second resistivity (e.g., a low resistance state (LRS)). Similarly, a 'reset' voltage (e.g., opposite to the set voltage in polarity) is applied across the upper and lower electrodes to change the variable resistance dielectric layer from the second resistivity back to the first resistivity, for example, from LRS to HRS. Therefore, in instances where the LRS and HRS correspond to logical "1" and logical "0" states (or vice versa), respectively, the 'set' and 'reset' voltages can be used to store digital data in the RRAM cell.

Various figures-of-merit are used to assess performance of an RRAM cell. In particular, among the various figures-of-merit, endurance of an RRAM cell is generally used to assess for which application the RRAM cell is suitable. Endurance of an RRAM cell is referred to the number of cycles (from HRS to LRS, or vice versa) the RRAM cell can endure before the HRS and LRS of the RRAM cell become indistinguishable. Depending on the type of application in which an RRAM cell will be used, an RRAM cell with a particular endurance level or range may be selected for a certain application. For example, when an RRAM cell is used for an electrical fuse (eFuse), the endurance of the eFuse RRAM cell is typically less than about 1,000 cycles. In another example, when an RRAM cell is used as a multi-time programmable (MTP) memory device, the endurance of the MTP RRAM device is typically between about 1,000 and 10,000 cycles. Yet in another example, when an RRAM cell is used to store data (e.g., a flash memory device), the endurance of such an RRAM cell is typically between about 10,000 and 100,000 cycles. The figures-of-merit (e.g., endurance, retention time, etc.) of an RRAM cell may be determined by selecting a particular thickness and/or crystalline structure of the variable resistance dielectric layer in the RRAM cell, as described in further detail below.

In order to fabricate an RRAM device having plural RRAM cells on a single chip/die that can be used in multiple applications (e.g., eFuse, MTP, data storage, etc.), conventionally, multiple recipes to form multiple variable resistance dielectric layers, each with different thickness and/or crystalline structure, are typically used. As such, extra amounts of time/cost/fabrication steps may be used to produce an RRAM device that can be used in two or more applications. Thus, the conventional RRAM devices have not been entirely satisfactory in every aspect.

Embodiments of the present disclosure provide a novel RRAM architecture that includes plural RRAM macros formed on a single chip and each RRAM macro can be used in a respective application simultaneously by applying a respective signal level to each RRAM macro. In some embodiments, each of the plural RRAM macros may respectively include an RRAM cell array, a word line (WL) driver, a bit line (BL) driver, and one or more multiplexers integrated therein. Further, each of the plural RRAM macros uses an universal variable resistance dielectric layer with a particular thickness and/or crystalline structure in its respective RRAM cell array. More particularly, such a variable resistance dielectric layer with a predetermined thickness and/or crystalline structure is formed by using a single recipe. That is, in some embodiments, even when only a single recipe is used to form the variable resistance dielectric layer, the disclosed RRAM architecture can incorporate multiple different structures or RRAM macros suitable for multiple applications (e.g., eFuse, MTP, data storage, etc.) on a single chip by using the single recipe. In stark contrast to conventional RRAM devices that require multiple recipes for integrating multiple macros on a chip, the disclosed RRAM architecture having multiple different macros for use in multiple different applications may be formed on a single chip using only one single recipe (to form a variable resistance dielectric layer with a particular thickness and/or crystalline structure).

FIG. 1 illustrates an exemplary block diagram of a disclosed RRAM architecture 100 in accordance with various embodiments. In the illustrated embodiment of FIG. 1, the RRAM architecture 100 is formed on a single chip/die 102, and the RRAM architecture 100 includes a control logic 104, a signal source 106 coupled to the control logic 104, and a plurality of RRAM macros 108, 110, and 112 that are each coupled to the control logic 104 and the signal source 106, respectively. In some embodiments, the signal source 106 may be provided by a voltage converter (e.g., a charge pump), which will be discussed in further detail with reference to FIGS. 6B and 6C. While any number of RRAM macros may be integrated into the RRAM architecture 100 and remain within the scope of the present disclosure, for clarity of discussion, three RRAM macros are shown in the illustrated embodiment of FIG. 1.

As described above, an RRAM macro may include its RRAM cell array, WL driver, BL driver, and multiplexers respectively corresponding to the WL and BL drivers. And an RRAM cell array may, include a plurality of RRAM cells in which each RRAM cell includes a variable resistance dielectric layer. Details of some embodiments of the RRAM macro will be provided below with reference to FIG. 2. In order to integrate multiple RRAM macros for use in multiple applications (e.g., eFuse, data storage, MTP, etc.) into one single chip, conventionally, the RRAM cell array of each RRAM macro may be fabricated by using a perspective recipe to form a particular variable resistance dielectric layer that is directed to being used in that particular RRAM macro/RRAM cell array. Using the illustrated embodiment of FIG. 1 as an example, conventional RRAM architectures generally use three different recipes to form three different variable resistance dielectric layers for the RRAM cell arrays of the RRAM macros 108, 110, and 112, respectively, if each of the RRAM macros is configured to be used in a different respective application. However, embodiments of the disclosed RRAM architecture 100 use only a single recipe to form a variable resistance dielectric layer that can be universally used by the RRAM cell arrays of the RRAM macros 108, 110, and 112. In some embodiments, instead of using a particular recipe for a particular macro, the control logic 104 of the disclosed RRAM architecture 100 controls the signal source 106 to apply a different signal level to access (e.g., set or reset) the different RRAM macros 108, 110, and 112, respectively, thereby enabling each of the RRAM macros to be used in a different application while still using a single recipe to form a variable resistance dielectric layer that is universally shared by the plurality of RRAM macros 108, 110, and 112. In this way, the disclosed RRAM architecture 100 may be used in multiple applications simultaneously while requiring no extra amount of time/cost to fabricate the RRAM architecture 100. An exemplary RRAM macro and its operation, an exemplary variable resistance dielectric layer, and operation of an exemplary RRAM architecture are described in further detail below with reference to FIGS. 2-6C.

Figure 2:
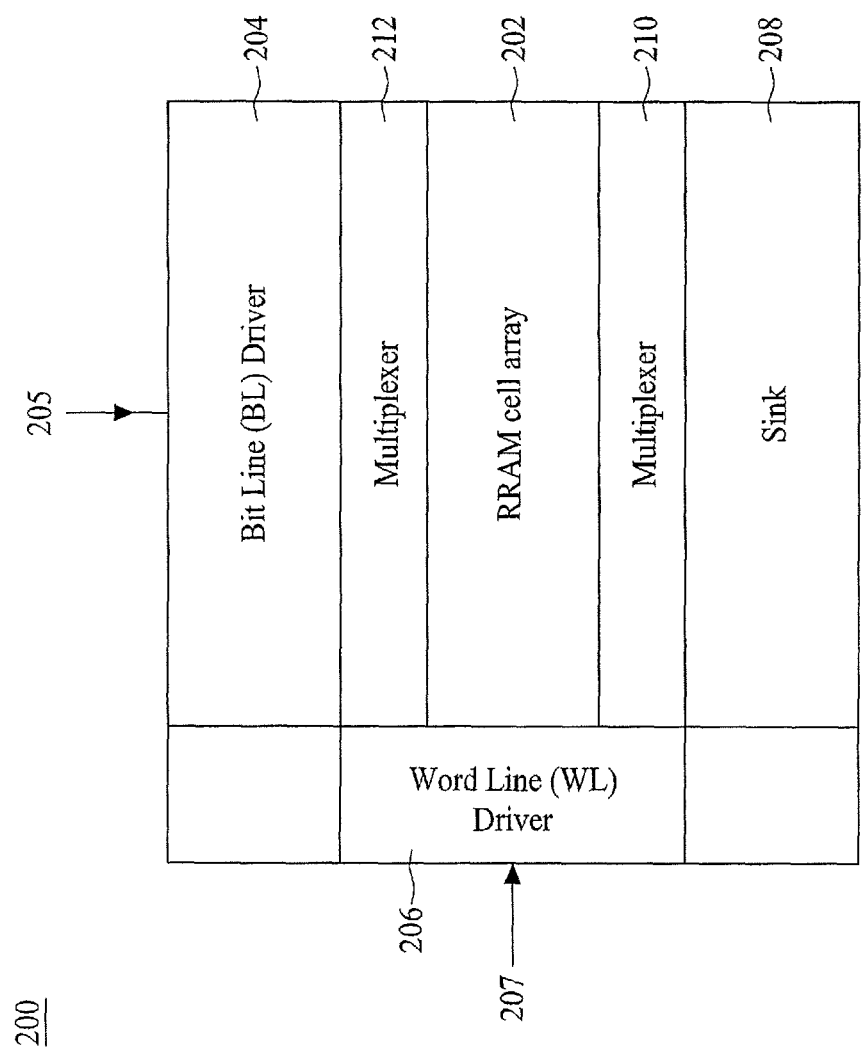
FIG. 2 illustrates an exemplary block diagram of an RRAM macro of the RRAM architecture of FIG. 1 in accordance with some embodiments.

FIG. 2 illustrates a block diagram of an exemplary RRAM macro 200 in accordance with some embodiments. One or more of the RRAM macros 108, 110, and 112 of FIG. 1 may be substantially similar to the RRAM macro 200 in the illustrated embodiment of FIG. 2. Thus, the RRAM macro 200 of FIG. 2 may be utilized as one or more of the macros 108, 110 and 112 of FIG. 1. As shown in FIG. 2, the RRAM macro 200 includes an RRAM cell array 202, a bit line (BL) driver 204, a word line (WL) driver 206, a (current) sink 208, a multiplexer 210 coupled between the RRAM cell array 202 and the sink 208, and a multiplexer 212 coupled between the BL driver 204 and the RRAM cell array 202. In some embodiments, the BL driver 204 is configured to receive signal 205, from the signal source 106 (FIG. 1), whose signal level is determined by the control logic 104 (FIG. 1); and the WL driver 206 is configured to receive signal 207, from the signal source 106, whose signal level is also determined by the control logic 104. In accordance with some embodiments, the signals 205 and 207 may be voltage signals, and accordingly the signal level, determined by the control logic 104, may be voltage levels. However, in some alternative embodiments, the signals 205 and 207 may be current signals while remaining within the scope of the present disclosure. Referring now to the sink 208, and the multiplexers 210 and 212, in some embodiments, each of the sink 208, and multiplexers 210 and 212 may include one or more switches/transistors, which will be described in further detail below with reference to FIG. 3.

Figure 3:
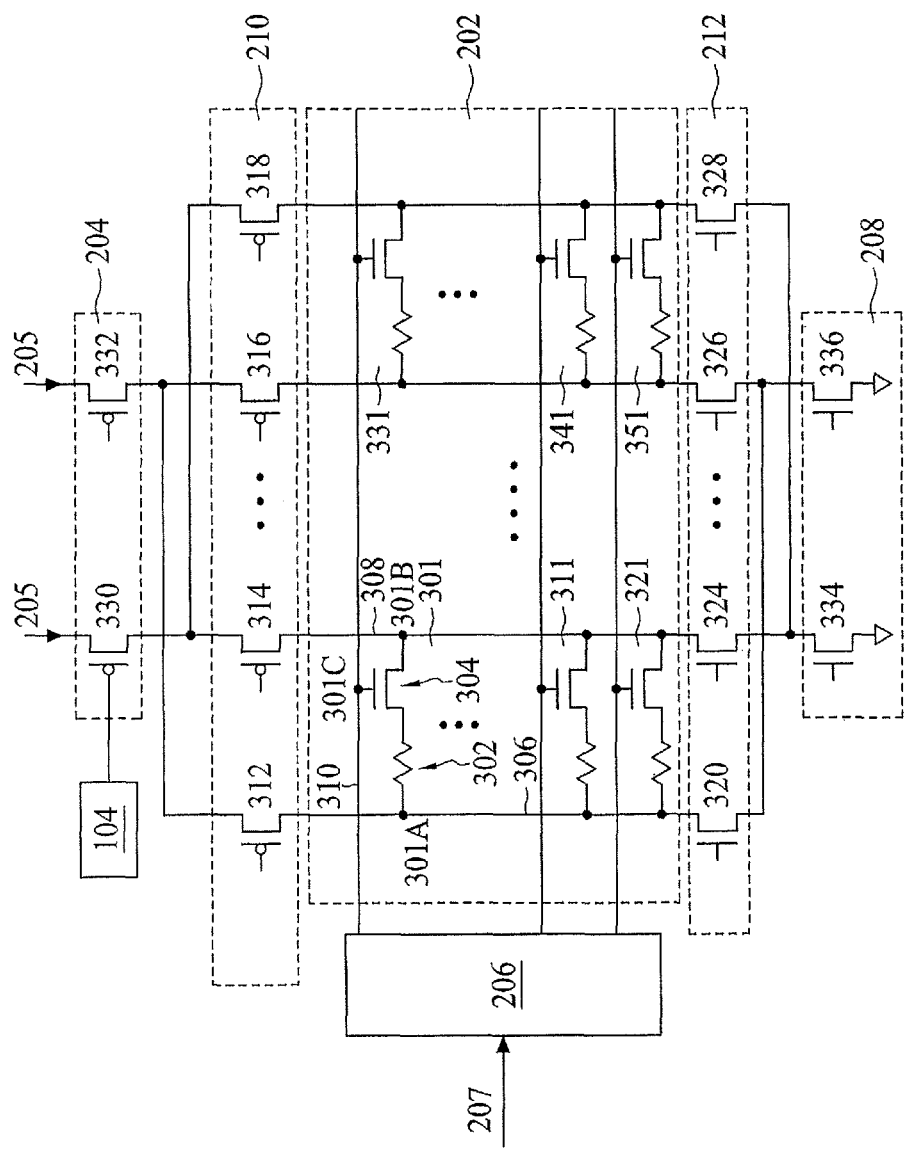
FIG. 3 illustrates an exemplary circuit schematic diagram of the RRAM macro of FIG. 2 in accordance with some embodiments.

FIG. 3 illustrates an exemplary circuit 300 of the RRAM macro 200 of FIG. 2 in accordance with some embodiments. In the illustrated embodiment of FIG. 3, the RRAM cell array 202 includes a plurality of RRAM cells 301, 311, 321, 331, 341, and up to 351 that are arranged in a column-row configuration, each cell comprising at least one transistor connected in series with at least one resistor as shown. For example, RRAM cells 301, 311, and up to 321 are arranged in a first column and each is arranged in a different row from one another; RRAM cells 331, 341, and up to 351 are arranged in a second column (different from the first column) and each is arranged in a different row from one another. Similarly, a plurality of RRAM cells 301 to 331 are arranged in a first row and each is arranged in a different column, with any desired number cells disposed between the cells 301 and 331 in the first row. For ease of discussion, the RRAM cells disposed and arranged between the cells 301 and 331 are not shown in the illustrated embodiment of FIG. 3. A plurality of RRAM cells 311 to 341 are arranged in a second row and each is arranged in a different column, with any desired number cells disposed between the cells 311 and 341 in the second row. Another plurality of RRAM cells 321 to 351 are arranged in a third row and each is arranged in a different column, with any desired number cells disposed between the cells 321 and 351 in the third row. For clarity, only six RRAM cells are shown in the illustrated embodiment of FIG. 3 even though any number of RRAM cells can be included in either a column direction or row direction of the RRAM cell array 202.

In the embodiment shown in FIG. 3, each of the RRAM cells is implemented as an 1T1R (1-transistor-1-resistor) structure. That is, each RRAM cell has a transistor and a resistor with a variable resistance. For example, as illustrated in FIG. 3, the RRAM cell 301 has a resistor 302 with a variable resistance and a transistor 304 that is coupled in series with the resistor 302. In some embodiments, the resistor 302 is formed as a multi-layer stack wherein the resistance of the resistor 302 varies with different voltages applied to the resistor 302, as described in further detail below with reference to FIG. 4A.

Referring still to the RRAM cell 301 of FIG. 3, the transistor 304 coupled, in series, to the resistor 302 is generally referred to as a "selection transistor," or an "enablement transistor" that is configured to enable a conduction path to flow through the coupled resistor 302, as described in further detail below. As shown in FIG. 3, the 1T1R structure (i.e., each of the RRAM cells 301, 311, 321, 331, 341, and 351) is formed as a three-terminal device that are coupled to three signal lines. Since each of the RRAM cells is substantially similar, for clarity, only the description of the RRAM cell 301 is provided below.

In the illustrated embodiment of FIG. 3, each of the three terminals 301A, 301B, and 301C of the RRAM cell 301 is coupled to signal lines 306, 308, and 310, respectively. The signal line 306 is generally referred to as "bit line (BL)" of the first column that includes the RRAM cell 301; the signal line 308 is generally referred to as "source line (SL)" of the first column; the signal line 310 is generally referred to as "word line (WL)" of the first row that includes the RRAM cell 301. In some embodiments, the signal lines 306, 308, and 310 are respectively referred to as the BL, the SL, and the WL of the RRAM cell 301. Referring still to the illustrated embodiment of FIG. 3, the BL 306 is coupled to the BL driver 204 through the multiplexer 210; the SL 308 is coupled to the BL driver 204 as well through the multiplexer 210; the WL 310 is coupled to the WL driver 206. In some embodiments, another multiplexer (not shown) may be included in the exemplary circuitry 300 that is coupled between the WL driver 206 and the word lines of the array 202, which includes the WL 310.

Referring still to the exemplary circuitry 300 in FIG. 3, in some embodiments, the BL driver 204 includes two transistors 330 and 332, the multiplexer 210 includes a plurality of pairs of transistors (312, 314) and up to (316, 318), the multiplexer 212 includes a plurality of pairs of transistors (320, 324) and up to (326, 328), and the sink 208 includes two transistors 334 and 336. In particular, the transistor 332 of the BL driver 204 is configured to receive the voltage signal 205 from the signal source 106 and is coupled to one of the pair of transistors, 312, the BL 306, at least one of the RRAM cells in the first column (e.g., 301, 311, and 321), the transistor 320, and the transistor 336 of the sink 208. And the transistor 330 of the BL driver 204 is configured to receive the voltage signal 205 from the signal source 106 and is coupled to the transistor 314, the SL 308, at least one of the RRAM cells in the first column (e.g., 301, 311, and 321), the transistor 324, and the transistor 334 of the sink 208.

In some embodiments, each of the transistors (312, 314, 316, 318, 320, 324, 326, 328, 330, 332, 334, and 336) of the BL driver 204, the multiplexers 210 and 212, and the sink 208 has a gate terminal that is coupled to the control logic 104 such that the control logic 104 may selectively switch on/off each of the transistors, as discussed in further detail below. For example, referring still to the illustrated embodiment of FIG. 3, a gate terminal of the transistor 330 of the BL driver 204 is shown coupled to the control logic 104. For purpose of clarity, although only the transistor 330 is shown as coupled to the control logic 104, each of the other transistors 312, 314, 316, 318, 320, 324, 326, 328, 332, 334, and 336 can be coupled to the control logic 104 in a substantially similar fashion.

Although, in FIG. 3, the RRAM cells (e.g., 301) of the RRAM cell array 202 are implemented as a 1-transistor-1-resistor (1T1R) structure, any of a variety of structures that exhibits the characteristic of variable resistance may be included in the RRAM cell such as, for example, an 1-diode-1-resistor (1D1R) structure, a 1-transistor-many resistors (1T-manyR) structure, a cross-bar structure, etc., while remaining within the scope of the present disclosure.

As described above, an RRAM cell typically includes a variable resistance dielectric layer which enables the RRAM cell to switch between the HRS and LRS by applying reset and set voltages, respectively, on the RRAM cell. Therefore, in instances where the LRS and HRS correspond to logical "1" and logical "0" states (or vice versa), respectively, the 'set' and 'reset' voltages can be used to store digital data in the RRAM cell.

Figure 4A:
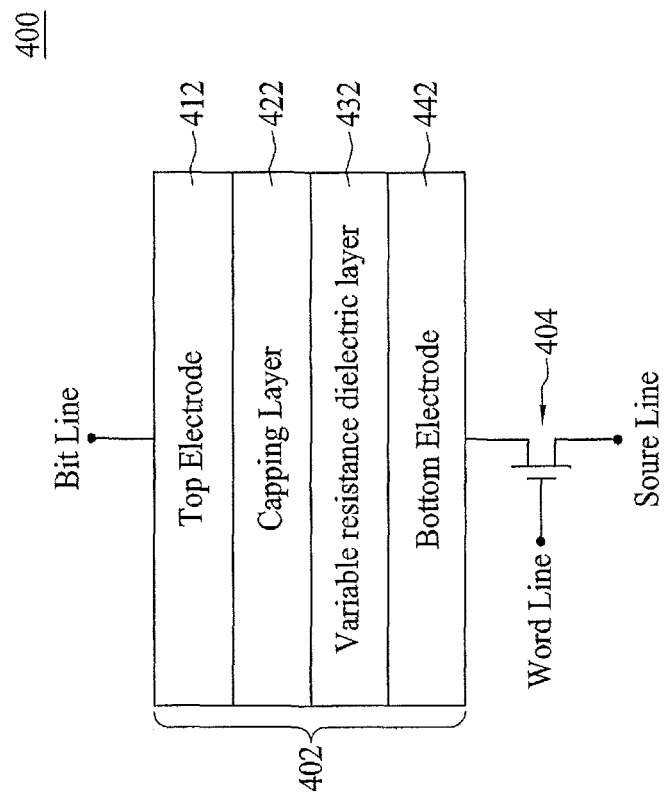
FIG. 4A illustrates an exemplary hybrid layout diagram and schematic of an RRAM cell of the RRAM macro of FIG. 3 in accordance with some embodiments.

FIG. 4A illustrates an exemplary structure 400 of the RRAM cell (1T1R structure) of FIG. 3 in accordance with some embodiments. In the illustrated embodiment of FIG. 4, the exemplary structure 400 includes a resistor 402 and a transistor 404 coupled to the resistor 402 in series, which can utilized to provide the resistor 302 and the transistor 304 of the RRAM cell 301, respectively. As shown in FIG. 4A, the resistor 402 is formed as a multi-layer stack that includes a top electrode 412, a capping layer 422, a variable resistance dielectric layer 432, and a bottom electrode 442. In some embodiments, the top electrode 412 may be formed from at least one of the materials selected from: Pt, TiN/Ti, TiN, Ru, Ni, and combinations thereof; the capping layer 422 may be formed from at least one of the transition metal materials such as, Ti, Ni, Hf, Nb, Co, Fe, Cu, V, Ta, W, Cr, and combinations thereof; the variable resistance dielectric layer 432 may be formed from at least one of the transition metal oxide materials such as, $TiO_x$, $NiO_x$, $HfO_x$, $NbO_x$, $CoO_x$, $FeO_x$, $CuO_x$, $VO_x$, $TaO_x$, $WO_x$, $CrO_x$, and combinations thereof; and the bottom electrode 442 may be folioed of at least one of the materials selected from: TiN, TaN, W, Pt, and combinations thereof. In some embodiments, the variable resistance dielectric layer 432 may include a high-k dielectric layer.

Figure 4B:
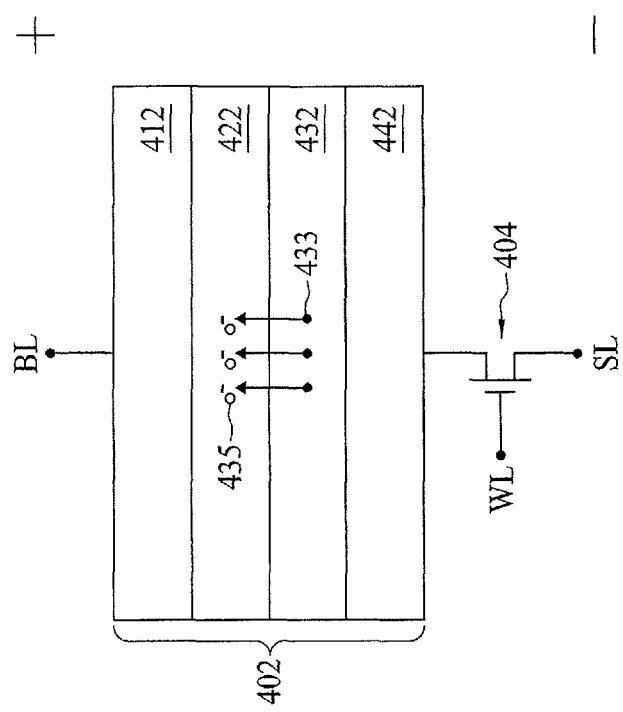
FIG. 4B illustrates an exemplary set operation of the RRAM cell of FIG. 4A in accordance with some embodiments.
Figure 4C:
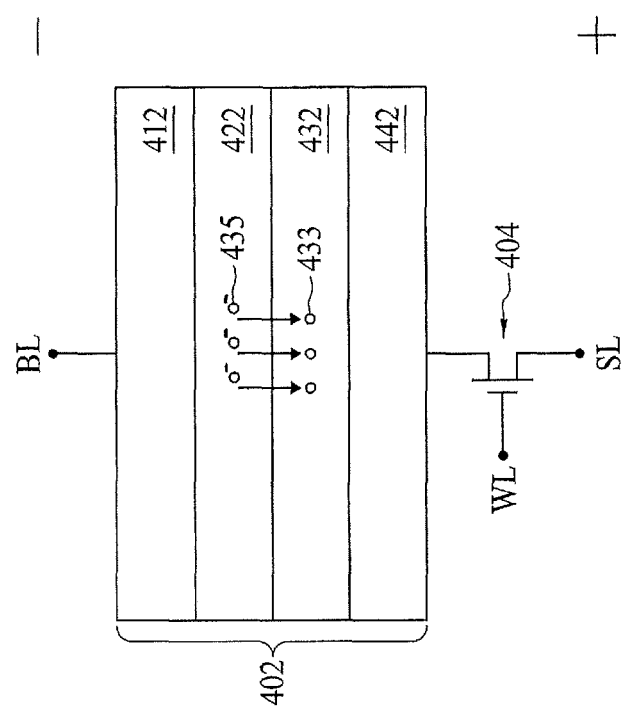
FIG. 4C illustrates an exemplary reset operation of the RRAM cell of FIG. 4A in accordance with some embodiments.

Referring now to FIGS. 4B and 4C, in some embodiments, the RRAM cell 400 has a bipolar switching behavior. That is, by changing a polarity of voltage applied to two terminals (i.e., BL and SL as shown in FIGS. 4B and 4C) of the RRAM cell, a direction of a current flowing through the RRAM cell will change accordingly. Referring first to FIG. 4B, to operate the RRAM cell 400, the transistor 404 is activated (i.e., turned on) by an enabling/selecting signal through the WL, and then a voltage with a first polarity (e.g., BL is provided with a positive voltage and SL is ground) is applied across the RRAM cell 400. As such, the higher voltage at BL pulls oxygen ions 435 to travel from the transition metal oxide layer 432 to the transition metal layer 422 and thus leaves oxygen vacancies 433 at the transition metal oxide layer 432, which allows electron(s) that are present in the bottom electrode 442 to travel (hop) from the bottom electrode 442 through the layers 432 and 422 to the top electrode 412. Accordingly, the variable resistor 402 is placed in a LRS state and a relatively higher magnitude of current flows from the BL to SL.

Referring now to FIG. 4C, the transistor 404 is activated (i.e., turned on) by an enabling/selecting signal through the WL, and then a voltage with a second polarity (e.g., SL is provided with a positive voltage and BL is ground) is applied across the RRAM cell 400. As such, the higher voltage at SL pulls oxygen ions 435 back from the transition metal layer 422 to the transition metal oxide layer 432 and thus fill some of oxygen vacancies 433 at the transition metal oxide layer 432, which prevents electron(s) that are present in the bottom electrode 442 to travel (hop) from the bottom electrode 442 through the layers 432 and 422 to the top electrode 412. Accordingly, the variable resistor 402 is in a HRS state and a lower magnitude of current flows from the SL to BL. In general, when a higher positive voltage is applied at the BL than the voltage at the SL (i.e., FIG. 4B), the variable resistance layer 432 exhibits a lower resistivity causing the RRAM cell 400 to be at the LRS, or at a logical "1." Accordingly, the voltage applied at the BL is typically referred to as a "set" voltage. Analogously, when a higher positive voltage applied at the SL than the voltage at the BL (i.e., FIG. 4C), the variable resistance layer 432 exhibits a higher resistivity causing the RRAM cell 400 to be at the FIRS, or at a logical "0." Accordingly, the voltage applied at the SL is typically referred to as a "reset" voltage.

In general, the variable resistance dielectric layer (e.g., a transition metal oxide layer) 432 is formed by deposition, for example, atomic layer deposition (ALD), chemical vapor deposition (CVD), meta-organic chemical vapor deposition (MOCVD), etc., to have a particular thickness and crystalline structure using a particular recipe. A recipe may include a variety of control parameters to control the deposition equipment, for example, gas flow rate, chamber pressure, partial pressure of a gas line, temperature, etc. To form a variable resistance dielectric layer with a particular thickness and crystalline structure a particular value for each of the variety of control parameters may be selected.

Conventionally, in order to enable an RRAM architecture to be used in multiple applications on a single chip (e.g., a first RRAM macro is used as a MTP device; a second RRAM macro is used as a data storage device; a third RRAM macro is used as an eFuse device), each of the RRAM macros may include a variable resistance dielectric layer with a respective thickness and/or crystalline structure. In other words, the variable resistance dielectric layer in the RRAM cell array of each of the RRAM macros may have a distinct thickness and/or crystalline structure so as to fit a designated application. Accordingly, multiple recipes are generally used. However, embodiments of the disclosed RRAM architecture 100 use only one single recipe to form a variable resistance dielectric layer that can be universally used (shared) by the plurality RRAM cell arrays of RRAM macros 108, 110, and 112 while each of the RRAM macros is designated for use in a respective application.

Although embodiments of the present disclosure are directed to implementing a variable resistance dielectric layer (formed by a single recipe) to be shared by a plurality of RRAM macros, the embodiments of using a single recipe to form a variable resistance dielectric layer to be shared by a plurality of NVM macros/cells may be used in any of a variety of NVM architectures such as, for example, megnetoresistive random access memory (MRAM), phase-change random access memory (MRAM), conductive-bridging random access memory (CBRAM), among others.

Referring back to FIG. 3, an example in which an RRAM cell of a single RRAM macro (108, 110, or 112) is accessed and written to be at a logical "1" is discussed. The following discussion will be in conjunction with FIGS. 1, 2, 4B, and 4C. When the control logic 104 (FIG. 1) determines to write a logical "1" on the RRAM cell 301 of the RRAM macro 108 (FIG. 2), the control logic 104 causes the signal source 106 (FIG. 1) to apply an enabling signal (e.g., 207) on the WL 310 of the first row through the WL driver 206 of the RRAM macro 108. All the selection transistors on the first row, including the selection transistor 304 is activated (turned on) by the enabling signal 207. The control logic 104 then activates (turn on) the transistor 332 of the BL driver 204, the transistor 312 of the multiplexer 210, the transistor 324 of the multiplexer 212, and the transistor 334 of the sink 208. Subsequently or simultaneously, the control logic 104 causes the signal source 106 to provide a positive "set voltage" (e.g., 205) to the BL 306 of the first row through the transistor 332 of the BL driver 204 and the transistor 312 of the multiplexer 210. As such, a higher positive voltage is applied on the BL so that a current path is formed to flow from the BL to the SL (i.e., the RRAM cell is at the LRS), as illustrated in FIG. 4B. In this example, the current may flow from the BL 306 to the SL 308 and continue to flow through the transistor 324 of the multiplexer 212 to the transistor 334 of the sink 208.

Referring still to FIG. 3, an example in which an RRAM cell of a single RRAM macro (108, 110, or 112) is accessed and written to be at a logical "0" is discussed. The following discussion will be in conjunction with FIGS. 1, 2, 4B, and 4C. When the control logic 104 determines to write a logical "0" on the RRAM cell 301 of the RRAM macro 108, the control logic 104 causes the signal source 106 to apply an enabling signal (e.g., 207) on the WL 310 of the first row through the WL driver 206 of the RRAM macro 108. All the selection transistors on the first row, including the selection transistor 304 is activated (turned on) by the enabling signal 207. The control logic 104 then activates (turn on) the transistor 330 of the BL driver 204, the transistor 314 of the multiplexer 210, the transistor 320 of the multiplexer 212, and the transistor 336 of the sink 208. Subsequently or simultaneously, the control logic 104 causes the signal source 106 to provide a positive "reset voltage" (e.g., 205) to the SL 308 of the first row through the transistor 330 of the BL driver 204 and the transistor 314 of the multiplexer 210. As such, a higher positive voltage is applied on the SL so that a current path is formed to flow from the SL to the BL (i.e., the RRAM cell is at the HRS), as illustrated in FIG. 4C. In this example, the current may flow from the SL 308 to the BL 306 and continue to flow through the transistor 320 of the multiplexer 212 to the transistor 336 of the sink 208.

As described above, the endurance of an RRAM cell is one of the figures-of-merit that is generally used to assess for which application the RRAM cell is suitable. In general, the higher the signal level (e.g., set voltage, reset voltage) is applied to an RRAM cell, the shorter the endurance the RRAM cell has, and vice versa. Thus, in accordance with some embodiments, with using one single recipe to form a variable resistance layer that can be integrated into multiple RRAM macros (e.g., 108, 110, and 112), the disclosed RRAM architecture 100 uses the control logic 104 to provide different signal levels to be applied to different RRAM macros, simultaneously, so as to cause each of the RRAM macros to have a respective endurance. As such, each of the RRAM macros in the disclosed RRAM architecture 100 may be used in a respective application.

Figure 5:
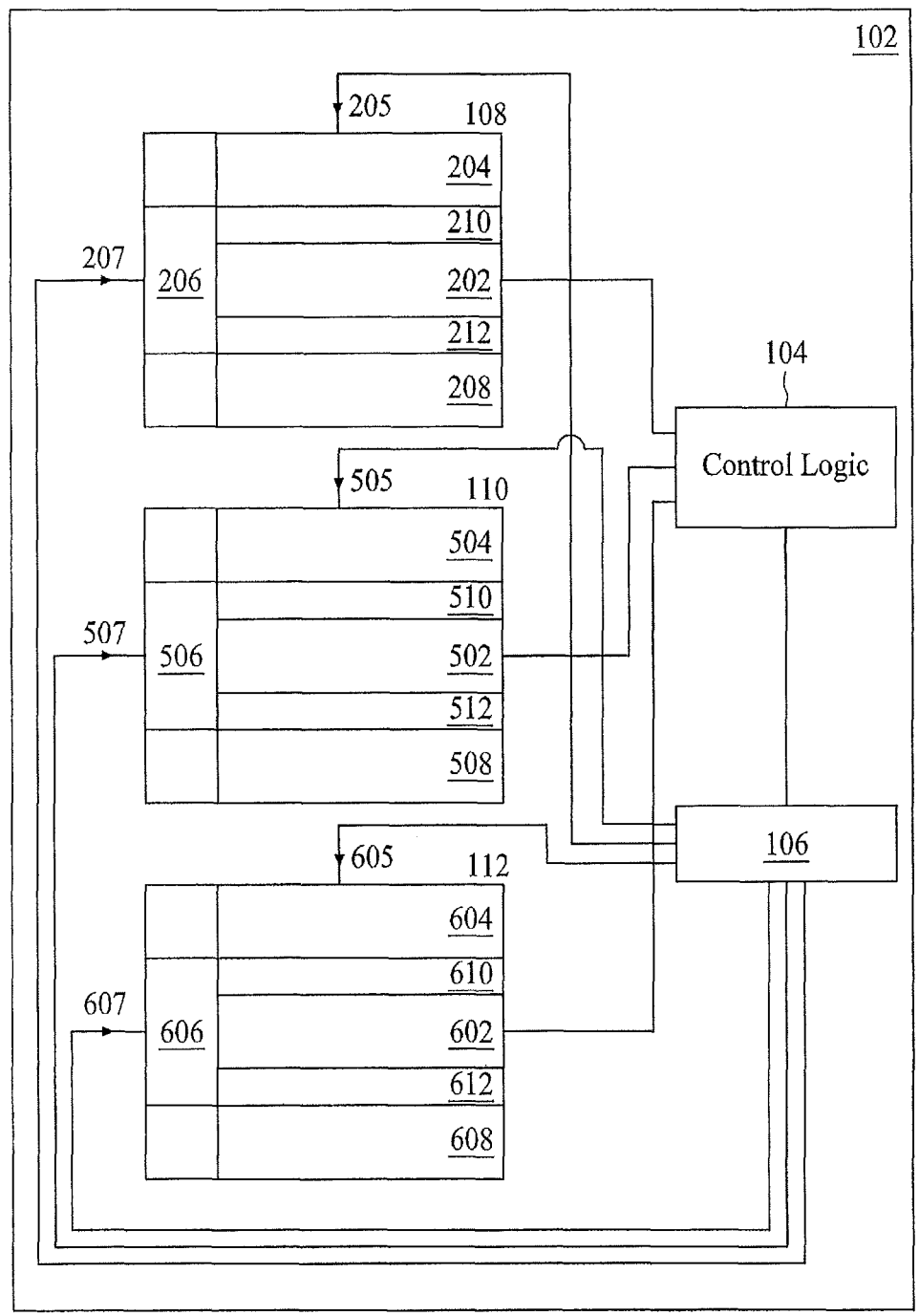
FIG. 5 illustrates a further block diagram of the RRAM architecture of FIG. 1 in accordance with some embodiments.

FIG. 5 illustrates an exemplary block diagram in which the RRAM architecture 100 includes multiple RRAM macros 108, 110, and 112 that share one variable resistance dielectric layer (formed by a single recipe) and are respectively used in different applications (i.e., different endurance) by applying different signal levels, in accordance with some embodiments. The following discussion of FIG. 5 will be provided in conjunction with FIGS. 1-3. As illustrated in the embodiment of FIG. 5, the RRAM macro 108 is substantially similar to the embodiment with reference to FIG. 2. In some embodiments, the RRAM macros 110 and 112 are substantially similar to the RRAM macro 108. That is, as illustrated in the exemplary block diagram of FIG. 5, the RRAM macro 110 also includes RRAM cell array 502, BL driver 504, WL driver 506, sink 508, and multiplexers 510 and 512, wherein the functionality of each of the components of the RRAM macro 110 may be similar to the corresponding component of RRAM macro 108, as described in FIG. 2. Similarly, the RRAM macro 112 also includes RRAM cell array 602, BL driver 604, WL driver 606, sink 608, and multiplexers 610 and 612, wherein each the functionality of each of the components may be similar to the corresponding component of RRAM macro 108, as described in FIG. 2. For example, the BL driver 504 of the RRAM macro 110 has a similar functionality as the BL drivers 204 and 604 of the RRAM macros 108 and 112, respectively.

Referring still to FIG. 5, the control logic 104 may cause the signal source 106 to provide the enabling signal 207 to activate the selection transistor(s) (e.g., 304 of FIG. 3) on one selected row of the RRAM cell array 202, and provide set/reset voltage signals 205 to one of the RRAM cells (e.g., 301 of FIG. 3) on the selected row through the BL driver 204. Similarly, the control logic 104 may cause the signal source 106 to provide another enabling signal 507 to activate selection transistor(s) on one selected row of the RRAM cell array 502, and provide set/reset voltage signals 505 to one of the RRAM cells on the selected row through the BL driver 504; and the control logic 104 may also cause the signal source 106 to provide another enabling signal 607 to activate selection transistor(s) on one selected row of the RRAM cell array 602, and provide set/reset voltage signals 605 to one of the RRAM cells on the selected row through the BL driver 604. In some embodiments, the signal level of each of the set/reset voltage signals 205, 505, and 605 applied to the RRAM macros 108, 110, and 112, respectively, may be different from each other. As such, despite using one single recipe to form a variable resistance layer with one particular crystalline structure and thickness, that variable resistance layer can be used (shared) by the RRAM cell arrays 202, 502, and 602, and, at the same time, each of the RRAM macros 108, 110, and 112 may be still used in a respective, different application. For example, when the RRAM macro 108 is used as an eFuse device (requiring the shortest endurance), the signal level of the set/reset voltage signal 205 may be between about 2.2 volts to about 3.5 volts; when the RRAM macro 110 is used as a data storage device (requiring the longest endurance), the signal level of the set/reset voltage signal 505 may be between about 0.5 volts to about 2.5 volts; when the RRAM macro 112 is used as a MTP device (requiring an intermediate endurance), the signal level of the set/reset voltage signal 605 may be between about 0.5 volts to 3.5 volts. The voltage levels and voltage ranges, listed above, are merely for exemplary purposes. Any voltage level(s)/range may be used to operate an RRAM macro for a particular application while remaining within the scope of the present disclosure.

Figure 6A:
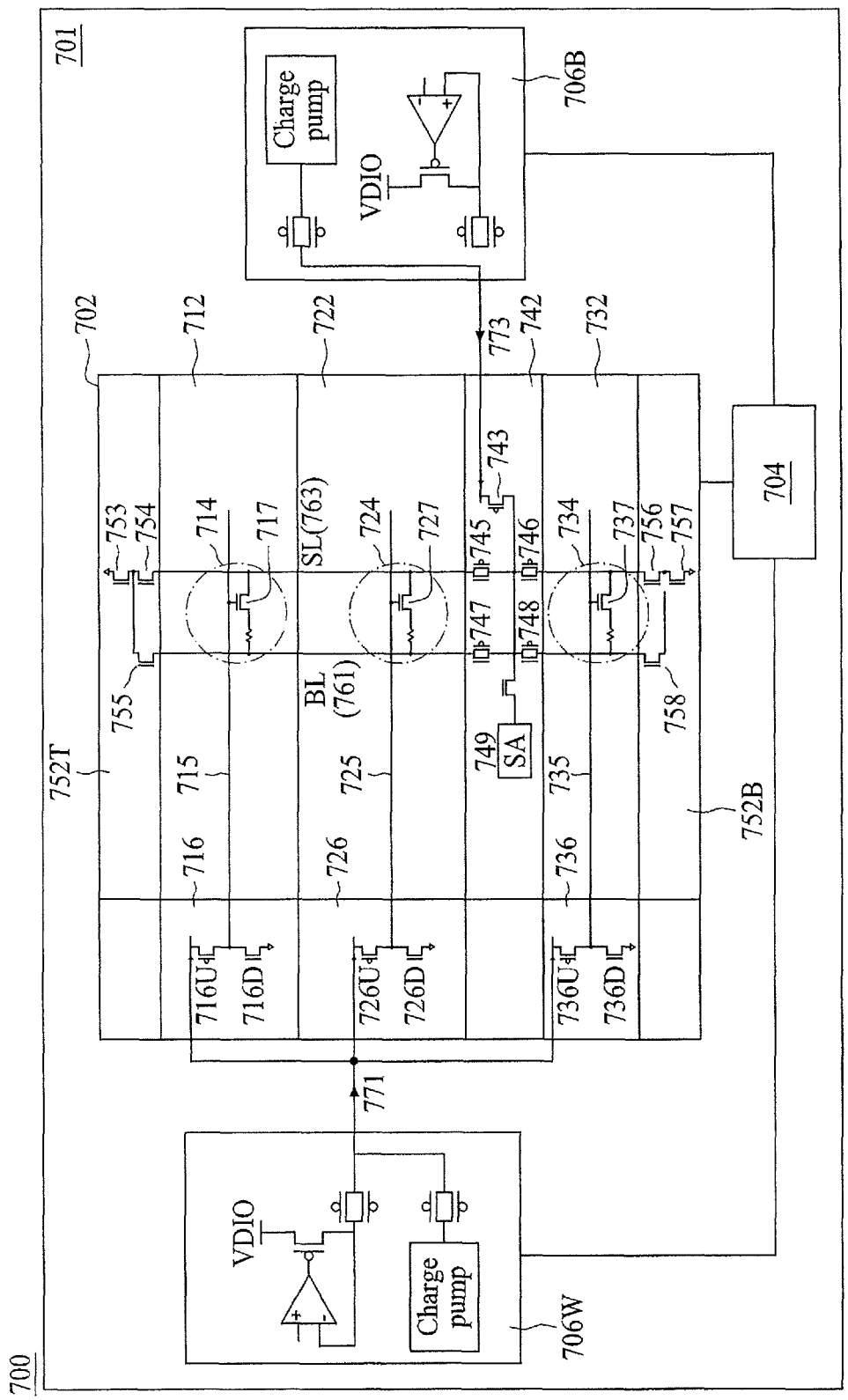
FIG. 6A illustrates an exemplary schematic diagram of another RRAM architecture in accordance with some embodiments.

FIG. 6A illustrates another exemplary RRAM architecture 700 formed on a single chip/die 701 in which an RRAM macro 702 includes multiple RRAM cell arrays 712, 722, and 732 that share one variable resistance dielectric layer (formed by a single recipe) and are respectively used in different applications (e.g., have different endurance) by applying different signal levels to the respective different RRAM cell arrays 712, 722 and 732, in accordance with various embodiments. The RRAM architecture 700 is substantially similar to the RRAM architecture 100 of FIG. 5 except that the multiple RRAM cell arrays 712, 722, and 732 are integrated in one single RRAM macro 702 with shared BL driver-multiplexer (BLD-MUX) 742 and shared sinks 752T and 752B, which will be discussed in further detail below. In the illustrated embodiment of FIG. 6A, the RRAM architecture 700 includes a control logic 704, signal sources 706B and 706W, the shared BLD-MUX 742, the shared sinks 752T and 752B, and WL drivers 716, 726, and 736 that are coupled to the RRAM cell arrays 712, 722, and 732, respectively.

Referring still to FIG. 6A, each of the RRAM cell arrays 712, 722 and 732 includes at least one RRAM cell. In the example illustrated in FIG. 6A, the RRAM cell array 712 includes an RRAM cell 714 that is formed as the 1T1R structure, as described with reference to FIG. 3; the RRAM cell array 722 includes an RRAM cell 724 that is formed as the 1T1R structure, as described with reference to FIG. 3; the RRAM cell array 732 includes an RRAM cell 734 that is formed as the 1T1R structure, as described with reference to FIG. 3. In some embodiments, the sinks 752T and 752B may have substantially similar functionality as the sink 208 of the RRAM macro 200 with reference to FIG. 2, and analogously include one or more transistors 753, 754, 755, 756, 757, and 758 that are each selectively controlled by the control logic 704 to be turned on/off. In some embodiments, the BLD-MUX 742, shown in FIG. 6A, may have substantially similar functionality as the multiplexers 210 and 212 and the BL driver 204 of the RRAM macro 200 with reference to FIG. 2. More specifically, the BLD-MUX 742 may further include a transistor 743, a plurality of multiplexers 745, 746, 747, and 748, and a sense amplifier (SA) 749. In the illustrated embodiment of FIG. 6A, the BLD-MUX 742 is coupled to the RRAM cell arrays 712, 722, and 732 via SL 763 and BL 761. Further, the RRAM cell arrays 714, 724, and 734 are coupled to the signal source 706W through WL drivers 716, 726, and 736 via corresponding WL's 715, 725, and 735, respectively. In some embodiments, each of the WL drivers include a pull-up transistor and a pull-down transistor that are coupled to each other in series. For example, the WL driver 716 includes a pull-up transistor 716U and a pull-down transistor 716D; the WL driver 726 includes a pull-up transistor 726U and a pull-down transistor 726D; the WL driver 736 includes a pull-up transistor 736U and a pull-down transistor 736D. Both of the pull-up and pull-down transistors in the WL drivers are coupled to the control logic 704 (not shown for purpose of clarity) and selectively controlled by the control logic 704 to be turned on/off.

Similar to the operation of the RRAM architecture 100 as described with reference to FIG. 5, to operate the RRAM architecture 700, the control logic 704 may first determine/select which of the RRAM cell arrays/cells to be set/reset. The control logic 704 causes the signal source 706W to provide an enabling signal to the selected RRAM cell array/cell through a corresponding WL driver and WL so as to activate (turn on) a selection transistor of the selected RRAM cell. The control logic 704 then causes the signal source 706B to provide a set/rest voltage signal with a first signal level to the selected RRAM cell through the BLD-MUX 742 so as to write a logical 1 or 0 to the selected RRAM cell. Subsequently, the control logic 704 may follow the operation described herein to write a logical 1 or 0 to another selected RRAM cell by using a set/rest voltage signal with a second signal level and yet another selected RRAM cell by using a set/rest voltage signal with a third signal level, wherein the first, second, and third signal levels are different from each other.

In some embodiments, the control logic 704 first selects the RRAM cell array 712, cell 714, to store a logical 1 or 0 for an eFuse application. The control logic 704 causes the signal source 706W to provide an enabling signal 771 to the RRAM cell 714 through the WL driver 716 and WL 715 thereby activating selection transistor 717 of the selected RRAM cell 714. The control logic 704 then causes the signal source 706B to provide a set/rest voltage signal 773 with a first signal level (e.g., about 2.2 volts to about 3.5 volts for an eFuse application) to the RRAM cell 714 through the BLD-MUX 742 and SL 763/BL 761 in order to write a logical 1 or 0 to the RRAM cell 714. Subsequently, the control logic 704 causes the signal source 706W to provide the enabling signal 771 to the RRAM cell 724 through the WL driver 726 and WL 725 thereby activating selection transistor 727 of the selected RRAM cell 724. The control logic 704 then causes the signal source 706B to provide a set/rest voltage signal 773 with a second signal level (e.g., about 0.5 volts to about 2.5 volts for a data storage application) to the RRAM cell 724 through the BLD-MUX 742 and SL 763/BL 761 in order to write a logical 1 or 0 to the RRAM cell 724. Finally, the control logic 704 may further causes the signal source 706W to provide the enabling signal 771 to the RRAM cell 734 through the WL driver 736 and WL 735 thereby activating selection transistor 737 of the selected RRAM cell 734. The control logic 704 then causes the signal source 706B to provide a set/rest voltage signal 773 with a third signal level (e.g., about 0.5 volts to about 3.5 volts for an MTP application) to the RRAM cell 734 through the BLD-MUX 742 and SL 763/BL 761 in order to write a logical 1 or 0 to the RRAM cell 734. As described above, even though only one recipe is used to from the variable resistance dielectric layer in the RRAM cell arrays 712, 722 and 732, these RRAM cell arrays may still be used in multiple different applications. That is, in the illustrated embodiment of FIG. 6A, the single RRAM macro 702 may be used in multiple applications by applying different signal levels to different RRAM cell arrays (e.g., 712, 722, and 732) while the different RRAM cell arrays use (share) a variable resistance dielectric layer formed by a same recipe.

Figure 6B:
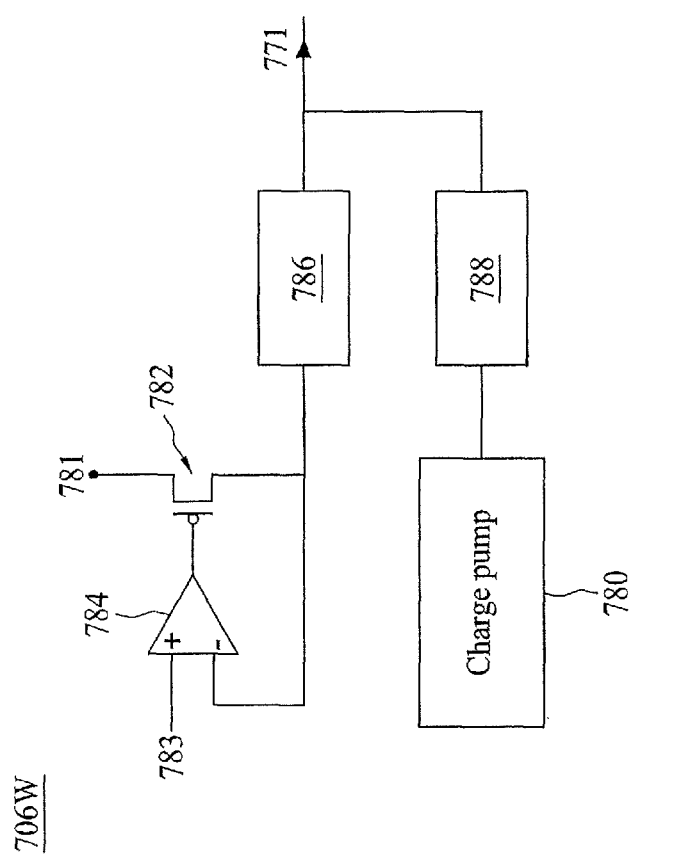
FIG. 6B illustrates an exemplary hybrid block and schematic diagram of a signal source of the RRAM architecture of FIG. 6A in accordance with some embodiments.

FIG. 6B illustrates an exemplary block diagram of the signal source 706W of FIG. 6A, in accordance with various embodiments. In the illustrated embodiment of FIG. 6B, the signal source 706W includes a voltage converter 780 (e.g., a charge pump), a transistor 782, a comparator 784 (e.g., an amplifier), a first multiplexer 786, and a second multiplexer 788. In some embodiments, the comparator 784 has two input terminals and an output terminal wherein one of the input terminals is configured to receive a first reference voltage 783. The output terminal of the comparator 784 is coupled to a gate terminal of the transistor 782, and the transistor 782 includes a source or a drain terminal coupled to a second reference voltage 781 and another drain or source terminal coupled to one of the input terminals of the comparator 784 and the first multiplexer 786. In some embodiments, the first multiplexer 786 is configured to provide the enabling signal 771 based on the second reference voltage 781. In some other embodiments, the charge pump 780 is configured to provide the enabling signal 771 through the second multiplexer 788 when a desired signal level of the enabling signal 771 is higher than the second reference voltage 781. In some embodiments, when the desired signal level of the enabling signal 771 is not greater than the second reference voltage 781, the enabling signal 771 may equal the second reference voltage 781. Despite not being shown, the multiplexers 786 and 788 may each include one or more additional inputs. The additional input may be coupled to an additional voltage source that is different from the first reference voltage 783 and the charge pump 780. As such, the multiplexer 786 may be able to select a desired signal level of the enabling signal 771 using the additional voltage source, and similarly, the multiplexer 788 may be able to select a desired signal level of the enabling signal 771 using the additional voltage source.

Figure 6C:
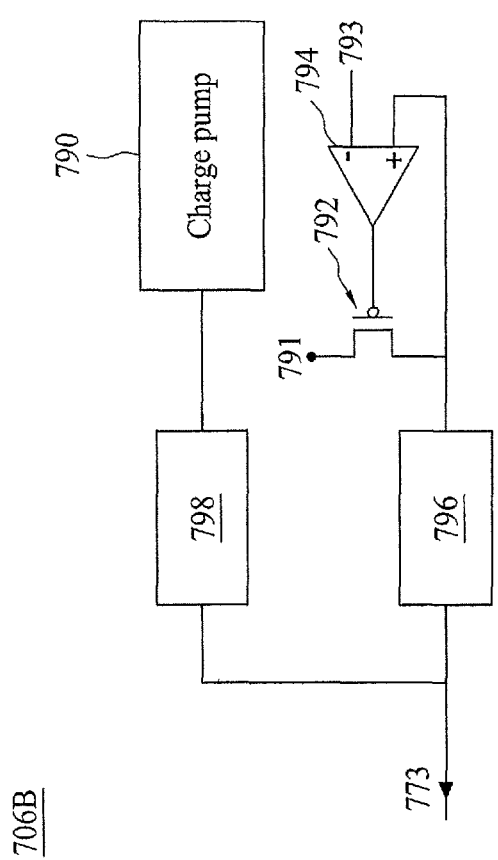
FIG. 6C illustrates an exemplary hybrid block and schematic diagram of another signal source of the RRAM architecture of FIG. 6A in accordance with some embodiments.

FIG. 6C illustrates an exemplary block diagram of the signal source 706B in accordance with various embodiments. In the illustrated embodiment of FIG. 6C, the signal source 706B includes a voltage converter 790 (e.g., a charge pump), a transistor 792, a comparator 794 (e.g., an amplifier), a first multiplexer 796, and a second multiplexer 798.

In some embodiments, the comparator 794 has two input terminals and an output terminal wherein one of the input terminals is configured to receive a first reference voltage 793. The output terminal of the comparator 794 is coupled to a gate terminal of the transistor 792, and the transistor 792 includes a source or a drain terminal coupled to a second reference voltage 791 and another drain or source terminal coupled to one of the input terminals of the comparator 794 and the first multiplexer 796. In some embodiments, the first multiplexer 796 is configured to provide the set/rest voltage 773 based on the second reference voltage 791. In some other embodiments, the charge pump 790 is configured to provide the set/rest voltage 773 through the second multiplexer 798 when a desired signal level of the set/rest voltage 773 is higher than the second reference voltage 791. In some embodiments, when the desired signal level of the set/rest voltage 773 is not greater than the second reference voltage 791, the set/rest voltage 773 may equal the second reference voltage 791. Despite not being shown, the multiplexers 796 and 798 may each include one or more additional inputs. The additional input may be coupled to an additional voltage source that is different from the first reference voltage 793 and the charge pump 790. As such, the multiplexer 796 may be able to select a desired signal level of the enabling signal 773 using the additional voltage source, and similarly, the multiplexer 798 may be able to select a desired signal level of the enabling signal 771 using the additional voltage source.

Figure 9:
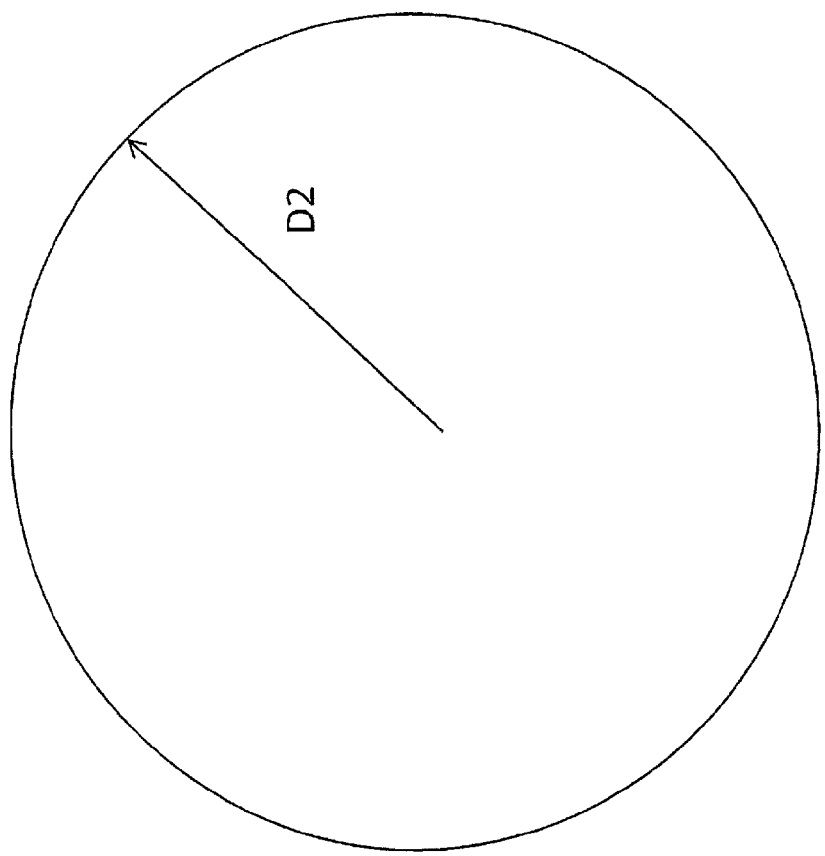
FIG. 9 illustrates an exemplary top-view of two curvilinear variable resistance dielectric layers each with a respective diameter in accordance with some embodiments.

In some alternative embodiments, instead of applying different signal levels of set/reset voltages to different RRAM macros and different RRAM cell arrays for different applications, as discussed in FIG. 5 and FIG. 6A, respectively, the RRAM cells of different RRAM macros/RRAM cell arrays may use a variable resistance dielectric layer with a different geometry and/or with a different geometry parameter (e.g., a diameter), as illustrated in FIG. 9. FIG. 9 illustrates an example in which two variable resistance dielectric layers both have substantially similar geometry but each has a respective diameter, from a top-view of the two variable resistance dielectric layers. In an example, referring to FIG. 9 and back to FIG. 5, each of the RRAM cells of the RRAM macro 108 has a curvilinear variable resistance dielectric layer 922 with a first diameter "D1," and each of the RRAM cells of the RRAM macro 110 has a curvilinear variable resistance dielectric layer 924 with a second diameter "D2," wherein the first diameter D1 is different from the second diameter D2. As such, due to the difference of the diameters, the RRAM macro 108 may be suitable for one application and the RRAM macro 110 may be suitable for another application. In another example, referring to the RRAM macro 702 of FIG. 6A and still using FIG. 9 as an example, each RRAM cell (e.g., 714) of the RRAM cell array 712 has a curvilinear variable resistance dielectric layer 922 with a first diameter D1, and each RRAM cell (e.g., 724) of the RRAM cell array 722 has a curvilinear variable resistance dielectric layer 924 with a second diameter D2, wherein the first diameter is different from the second diameter. As such, due to the difference of the diameters, the RRAM cell array 712 may be suitable for one application and the RRAM cell array 722 may be suitable for another application.

Figure 7:
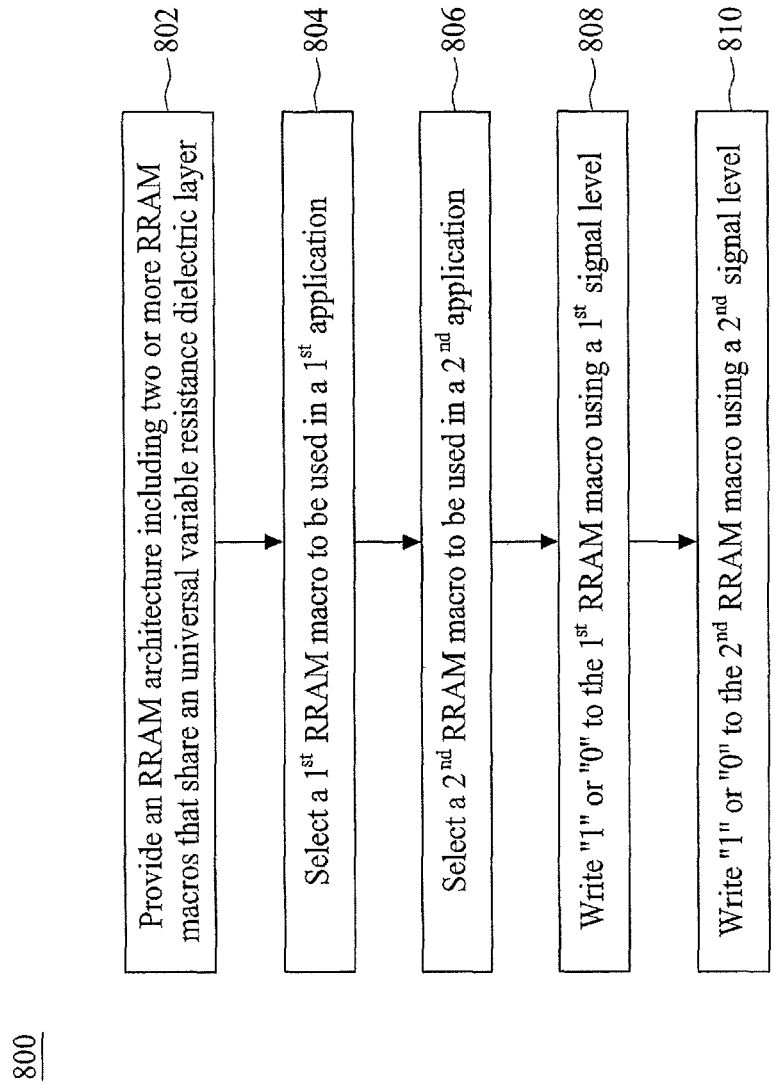
FIG. 7 illustrates a flow chart of an exemplary method to operate the RRAM architecture of FIG. 5 in accordance with some embodiments.

FIG. 7 illustrates an exemplary flow chart of a method 800 for operating the RRAM architecture 100 of FIGS. 1 and 5 in accordance with various aspects of the present disclosure in one or more embodiments. It is understood that additional steps can be provided before, during, and/or after the method 800, and some of the steps can be replaced, eliminated, and/or removed in accordance with various alternative embodiments.

Referring now to FIG. 7, the method 800 starts at operation 802 at which an RRAM architecture including two or more RRAM macros that share an universal variable resistance dielectric layer is provided. In one example, such an RRAM architecture may include the RRAM architecture 100. As discussed with reference to FIG. 6, the RRAM architecture 100 includes at least three RRAM macros 108, 110, and 112 disposed on the single chip 102, and the RRAM cells in each of the RRAM cell arrays/RRAM macros include an universal variable resistance dielectric layer (e.g., 432 with references to FIGS. 4A-4C) that is formed by a single recipe.

The method 800 continues to operation 804 at which a first RRAM macro to be used in a first application (e.g., eFuse) is selected. In some embodiments, simultaneously or subsequently, the method 800 continues to operation 806 in which a second RRAM macro to be used in a second application (e.g., MTP or data storage) is selected. In some embodiments, the second application is different from the first application. For example, the first RRAM macro may be selected to be used in an eFuse application, and the second RRAM macro may be selected to be used in a data storage application. In some embodiments, such selection may be performed by the control logic 104.

Referring still to FIG. 7, in response to the operation 804, the method 800 continues to operation 808 at which either a logical 1 or 0 is written to the first RRAM macro's RRAM cell array by using a voltage signal with a first signal level. Similarly, in response to operation 806, the method 800 continues to operation 810 at which either a logical 1 or 0 is written to the second RRAM macro's RRAM cell array by using a voltage signal with a second signal level. As described above, in some embodiments, the operations 804 and 806 may be simultaneously performed (i.e., the first and second RRAM macros being simultaneously selected to be used in the first and second application, respectively). Accordingly, in such embodiments, the operations 808 and 810 may be simultaneously performed in response to the operations 804 and 806, respectively. In some embodiments, the operation 806 may be performed subsequently after the operation 804. As such, the operation 808 is performed in response to the operation 804 and then the operation 810 is subsequently performed after the operation 808.

Continuing with the example used above and referring to FIG. 5, the control logic 104 of the RRAM architecture 100, coupled to the RRAM macros 108, 110, and 112 and the signal source 106, is configured to control each of the RRAM macros and provide a particular signal level of a set/reset voltage to be applied to each RRAM macro through the signal source 106 so that each RRAM macro may exhibit a different level of endurance (e.g., <1,000 cycles, between 1,000 and 10,000 cycles, between 10,000 and 100,000 cycles, etc.), as described above. Referring to FIGS. 5 and 7 concurrently, in some embodiments, the control logic 104 may select the RRAM macro 108 to be used in an eFuse application at operation 804, and may select the RRAM macro 110 to be used in a data storage application at operation 806. In response to the selection at operation 804, at operation 808, the control logic 104 causes the signal source 106 to provide the set/reset voltage 207 with the first signal level to the RRAM macro 108 through the RRAM macro 108's components (204, 206, 208, 210, and 212), as described above. As such, the RRAM cells of the RRAM cell array 202 may be written with either a logical 1 or 0 using the set/reset voltage 207 with the first signal level.

Subsequently or simultaneously, in response to the selection at operation 806, at operation 810, the control logic 104 causes the signal source 106 to provide the set/reset voltage 507 with the second signal level to the RRAM macro 110. Similarly, the RRAM cells of the RRAM cell array 502 may be written with either a logical 1 or 0 using the set/reset voltage 507 with the second signal level through the RRAM macro 110's components (504, 506, 508, 510, and 512).

Figure 8:
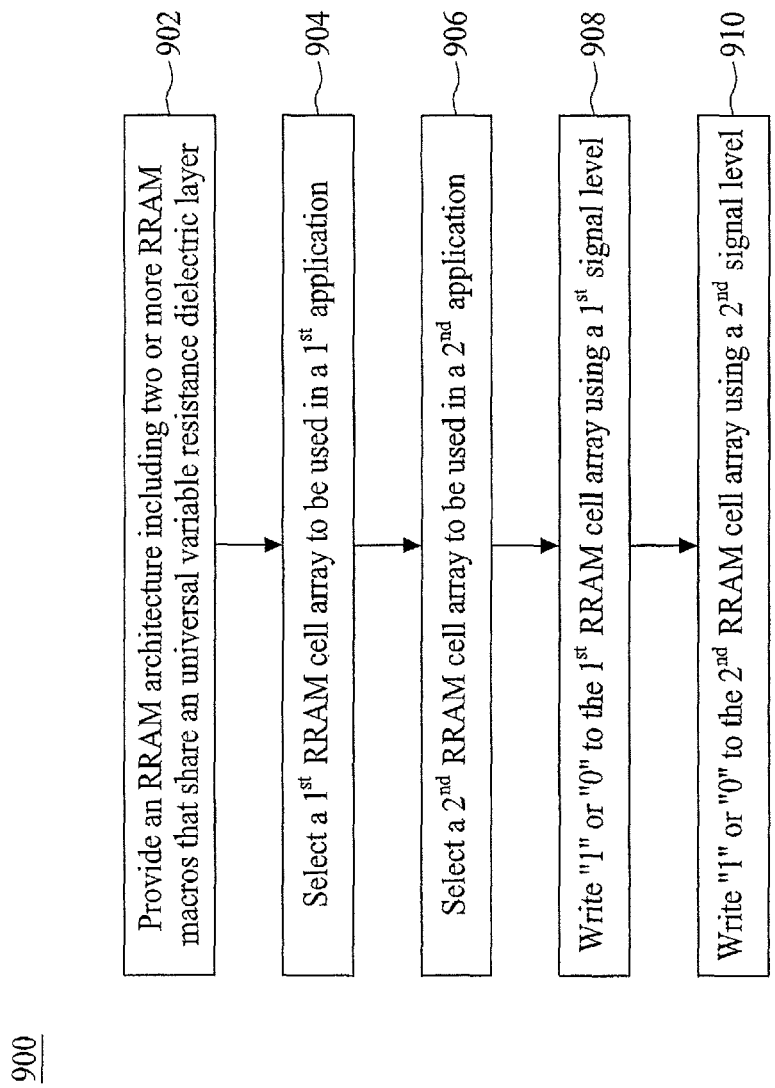
FIG. 8 illustrates a flow chart of an exemplary method to operate the RRAM architecture of FIG. 6A in accordance with some embodiments.

FIG. 8 illustrates an exemplary flow chart of a method 900 for operating the RRAM architecture 700 of FIG. 6A in accordance with various aspects of the present disclosure in one or more embodiments. It is understood that additional steps can be provided before, during, and/or after the method 900, and some of the steps can be replaced, eliminated, and/or removed in accordance with various alternative embodiments.

Referring now to FIG. 8, the method 900 starts at operation 902 at which an RRAM architecture including two or more RRAM cell arrays that share an universal variable resistance dielectric layer is provided. In some embodiments, the two or more RRAM cell arrays may share a BL driver and one or more multiplexers but each of the RRAM cell arrays corresponds to a respective WL driver. In one example, such an RRAM architecture may include the RRAM architecture 700. As discussed with reference to FIG. 6A, the RRAM architecture 700 includes at least three RRAM cell arrays 712, 722, and 732 disposed on the single chip 701, and the RRAM cells in each of the RRAM cell arrays include an universal variable resistance dielectric layer (e.g., 432 with references to FIGS. 4A-4C) that is formed by a single recipe.

The method 900 continues to operation 904 at which a first RRAM cell array is selected to be used in a first application (e.g., eFuse). In some embodiments, subsequently, the method 900 continues to operation 906 in which a second RRAM cell array is selected to be used in a second application (e.g., MTP or data storage). In some embodiments, the second application is different from the first application. For example, the first RRAM cell array may be selected to be used in an eFuse application, and the second RRAM cell array may be selected to be used in a data storage application. In some embodiments, such selection may be performed by the control logic 104.

In some embodiments, as illustrated in FIG. 8, after the selections of the applications on the first and second RRAM cell arrays (i.e., operations 904 and 906), the method 900 may continue to operations 908 at which either a logical 1 or 0 is written to the first RRAM cell array's RRAM cell by using a voltage signal with a first signal level, and subsequently to operation 910 at which either a logical 1 or 0 is written to the second RRAM cell array's RRAM cell by using a voltage signal with a second signal level.

Referring still to FIG. 8, in some embodiments, in response to the operation 904 with selecting the first RRAM cell array to be used in the first application, the method 900 may route to operation 908 at which either a logical 1 or 0 is written to the first RRAM cell array's RRAM cell by using a voltage signal with a first signal level. Similarly, in response to the operation 906 with selecting the second RRAM cell array to be used in the second application, the method 900 may route to operation 910 at which either a logical 1 or 0 is written to the second RRAM cell array's RRAM cell array by using a voltage signal with a second signal level. As such, the operation 908 (in response to the operation 904) may be performed before the operation 906 and then the operation 910 (in response to the operation 906) is subsequently performed. In some embodiments, the operation 906 may be performed subsequently after the operation 904.

Continuing with the example used above and referring to FIG. 6A, the control logic 704 of the RRAM architecture 700, coupled to the RRAM cell arrays 712, 722, and 732, the sinks 752T and 752B, the BLD-MUX 742, and the signal sources 706B and 706W, is configured to control the sinks 752T and 752B, and the BLD-MUX 742 and provide a particular signal level of a set/reset voltage to be applied to each RRAM cell array through the signal source 706B so that each RRAM cell array may exhibit a different level of endurance (e.g., <1,000 cycles, between 1,000 and 10,000 cycles, between 10,000 and 100,000 cycles, etc.), as described above.

Referring back to FIG. 8 and concurrently with FIG. 6A, in some embodiments, the control logic 704 may select the RRAM cell array 712 to be used in eFuse application at operation 904, and may select the RRAM cell array 722 to be used in data storage application at operation 906. In response to the selection at operation 904, at operation 908, the control logic 704 activates the RRAM cell array 712 by causing the signal source 706W to provide the enabling signal 771 to the RRAM cell array 712 through the RRAM cell array 712's corresponding WL driver 716, and causes the signal source 706B to provide the set/reset voltage 773 with the first signal level to the activated RRAM cell array 712 through the shared components (742, 752T, and 752B). As such, the RRAM cells (e.g., 714) of the RRAM cell array 712 may be written with either a logical 1 or 0 using the set/reset voltage 773 with the first signal level. Subsequently, in response to the selection at operation 906, at operation 910, the control logic 704 activates the RRAM cell array 722 by causing the signal source 706W to provide the enabling signal 771 to the RRAM cell array 722 through the RRAM cell array 722's corresponding WL driver 726, and causes the signal source 706B to provide the set/reset voltage 773 with the second signal level to the activated RRAM cell array 722 through the shared components (742, 752T, and 752B). As such, the RRAM cells (e.g., 724) of the RRAM cell array 722 may be written with either logical 1 or 0 using the set/reset voltage 773 with the second signal level.

In an embodiment, a memory architecture includes: a first memory macro comprising a first plurality of memory cells that each comprises a first variable resistance dielectric layer with a first geometry parameter; and a second memory macro comprising a second plurality of memory cells that each comprises a second variable resistance dielectric layer with a second geometry parameter, wherein the first geometry parameter is different from the second geometry parameter thereby causing the first and second memory macros to have first and second endurances, wherein the first and second variable resistance dielectric layers are formed using a single process recipe, and wherein the first endurance comprises a maximum number of cycles for which the first plurality of memory cells can transition between first and second logical states, and the second endurance comprises a maximum number of cycles for which the second plurality of memory cells can transition between the first and second logical states.

In another embodiment, a resistive random access memory (RRAM) architecture includes: a first RRAM cell array comprising a first plurality of RRAM cells that each comprises a first variable resistance dielectric layer with a first geometry parameter; and a second RRAM cell array coupled to the first RRAM cell array, comprising a second plurality of RRAM cells that each comprises a second variable resistance dielectric layer with a second geometry parameter; wherein the first geometry parameter is different from the second geometry parameter thereby causing the first and second memory macros to have first and second endurances, wherein the first and second variable resistance dielectric layers are formed using a single process recipe, and wherein the first endurance comprises a maximum number of cycles for which the first plurality of memory cells can transition between first and second logical states, and the second endurance comprises a maximum number of cycles for which the second plurality of memory cells can transition between the first and second logical states.

Yet in another embodiment, a memory architecture includes: a first memory macro comprising a first plurality of memory cells, wherein each of the first plurality of memory cells comprises a first variable resistance dielectric layer formed in a curvilinear shape with a first diameter; and a second memory macro comprising a second plurality of memory cells, wherein each of the second plurality of memory cells comprises a second variable resistance dielectric layer formed in the curvilinear shape with a second diameter, wherein the first diameter is different from the second diameter thereby causing the first and second memory macros to have first and second endurances, wherein the first and second variable resistance dielectric layers are formed using a single process recipe, and wherein the first endurance comprises a maximum number of cycles for which the first plurality of memory cells can transition between first and second logical states, and the second endurance comprises a maximum number of cycles for which the second plurality of memory cells can transition between the first and second logical states.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory architecture, comprising:
   a first memory macro comprising a first plurality of memory cells that each comprises a first variable resistance dielectric layer with a first geometry parameter; and
   a second memory macro comprising a second plurality of memory cells that each comprises a second variable resistance dielectric layer with a second geometry parameter,
   wherein the first geometry parameter is different from the second geometry parameter thereby causing the first and second memory macros to have first and second endurances,
   wherein the first and second variable resistance dielectric layers are formed using a single process recipe, and
   wherein the first endurance comprises a maximum number of cycles for which the first plurality of memory cells can transition between first and second logical states, and the second endurance comprises a maximum number of cycles for which the second plurality of memory cells can transition between the first and second logical states.

2. The architecture of claim 1 wherein the first variable resistance dielectric layer has a curvilinear shape and the first geometry parameter is a diameter of the first variable resistance dielectric layer, and second variable resistance dielectric layer has the curvilinear shape and the second geometry parameter is a diameter of the second variable resistance dielectric layer.

3. The architecture of claim 1 wherein the first memory macro comprises a resistive random access memory (RRAM) macro, the first plurality of memory cells comprise a first plurality of RRAM cells, the second memory macro comprises an RRAM macro, the second plurality of memory cells comprise a second plurality of RRAM cells.

4. The architecture of claim 1 wherein the first logical state comprises logical 1 and the second logical state comprises logical 0.

5. The architecture of claim 4 wherein when a control logic writes the logical 1 to the memory cell, the control logic uses a voltage signal with a first polarity, and when the control logic writes the logical 0 to the memory cell, the control logic uses the voltage signal with a second polarity that is opposite to the first polarity.

6. The architecture of claim 1 wherein the first memory macro further comprises:
   a first bit line (BL) driver coupled to the first plurality of memory cells; and
   a first word line (WL) driver coupled to the first plurality of memory cells.

7. The architecture of claim 6 wherein the second memory macro further comprises:
   a second bit line (BL) driver coupled to the second plurality of memory cells; and
   a second word line (WL) driver coupled to the second plurality of memory cells.

8. The architecture of claim 7 wherein the first and second BL drivers, and the first and second WL drivers are different from each other, respectively.

9. A resistive random access memory (RRAM) architecture, comprising:
   a first RRAM cell array comprising a first plurality of RRAM cells that each comprises a first variable resistance dielectric layer with a first geometry parameter; and
   a second RRAM cell array coupled to the first RRAM cell array, comprising a second plurality of RRAM cells that each comprises a second variable resistance dielectric layer with a second geometry parameter;
   wherein the first geometry parameter is different from the second geometry parameter thereby causing the first and second memory macros to have first and second endurances,
   wherein the first and second variable resistance dielectric layers are formed using a single process recipe, and
   wherein the first endurance comprises a maximum number of cycles for which the first plurality of memory cells can transition between first and second logical states, and the second endurance comprises a maximum number of cycles for which the second plurality of memory cells can transition between the first and second logical states.

10. The architecture of claim 9 wherein the first variable resistance dielectric layer has a curvilinear shape and the first geometry parameter is a diameter of the first variable resistance dielectric layer, and second variable resistance dielectric layer has the curvilinear shape and the second geometry parameter is a diameter of the second variable resistance dielectric layer.

11. The architecture of claim 9 wherein the first and second variable resistance dielectric layers comprise a thickness and crystalline structure that is formed by using a single recipe of deposition equipment.

12. The architecture of claim 9 wherein when a control logic writes logical 1 of the logical state to the RRAM cell, the control logic uses a voltage signal with a first polarity, and when the control logic writes logical 0 of the logical state to the RRAM cell, the control logic uses the voltage signal with a second polarity that is opposite to the first polarity.

13. The architecture of claim 9 wherein the first and second RRAM cell arrays are formed as an RRAM macro on a single chip, and wherein the first and second pluralities of the RRAM cells comprise identical variable resistance dielectric layer.

14. The architecture of claim 13 wherein the RRAM macro further comprises: a bit line (BL) driver coupled to the first and second RRAM cell array.

15. The architecture of claim 13 wherein the RRAM macro further comprises:
a first word line (WL) driver coupled between the first plurality of RRAM cells and a control logic.

16. The architecture of claim 15 wherein the RRAM macro further comprises:
a second word line (WL) driver coupled between the second plurality of RRAM cells and the control logic, the second WL driver being different from the first WL driver.

17. A memory architecture, comprising:
a first memory macro comprising a first plurality of memory cells, wherein each of the first plurality of memory cells comprises a first variable resistance dielectric layer formed in a curvilinear shape with a first diameter; and
a second memory macro comprising a second plurality of memory cells, wherein each of the second plurality of memory cells comprises a second variable resistance dielectric layer formed in the curvilinear shape with a second diameter,
wherein the first diameter is different from the second diameter thereby causing the first and second memory macros to have first and second endurances,
wherein the first and second variable resistance dielectric layers are formed using a single process recipe, and
wherein the first endurance comprises a maximum number of cycles for which the first plurality of memory cells can transition between first and second logical states, and the second endurance comprises a maximum number of cycles for which the second plurality of memory cells can transition between the first and second logical states.

18. The architecture of claim 17 wherein the first memory macro comprises a resistive random access memory (RRAM) macro, the first plurality of memory cells comprise a first plurality of RRAM cells, the second memory macro comprises an RRAM macro, the second plurality of memory cells comprise a second plurality of RRAM cells.

19. The architecture of claim 17 wherein the first memory macro further comprises:
a first bit line (BL) driver coupled to the first plurality of memory cells; and
a first word line (WL) driver coupled to the first plurality of memory cells.

20. The architecture of claim 17 wherein the second memory macro further comprises:
a second bit line (BL) driver coupled to the second plurality of memory cells; and
a second word line (WL) driver coupled to the second plurality of memory cells.

* * * * *